(12) United States Patent
Alden, III et al.

(10) Patent No.: US 8,840,432 B2
(45) Date of Patent: Sep. 23, 2014

(54) CIRCUIT BOARD AND WIRE ASSEMBLY

(75) Inventors: Wayne Stewart Alden, III, Whitman, MA (US); Jeffery W. Mason, North Attleboro, MA (US)

(73) Assignee: Tyco Electronics Corporation, Berwyn, PA (US)

( * ) Notice: Subject to any disclaimer, the term of this patent is extended or adjusted under 35 U.S.C. 154(b) by 319 days.

(21) Appl. No.: 13/454,556

(22) Filed: Apr. 24, 2012

(65) Prior Publication Data

US 2013/0280955 A1    Oct. 24, 2013

(51) Int. Cl.
  *H01R 13/648*  (2006.01)
  *H01R 13/6585*  (2011.01)
  *H01R 9/05*  (2006.01)
  *H01R 24/50*  (2011.01)

(52) U.S. Cl.
  CPC .......... *H01R 13/6585* (2013.01); *H01R 9/0515* (2013.01); *H01R 24/50* (2013.01)
  USPC ................................ 439/607.46; 439/607.35

(58) Field of Classification Search
  USPC ........ 439/607.28, 607.35, 607.41, 607.49, 98
  See application file for complete search history.

(56) References Cited

U.S. PATENT DOCUMENTS

| | | | |
|---|---|---|---|
| 6,380,485 B1 | 4/2002 | Beaman et al. | |
| 6,869,308 B2 | 3/2005 | Wu | |
| 7,052,311 B2 | 5/2006 | Kondou et al. | |
| 7,137,825 B2 | 11/2006 | Myer et al. | |
| 7,845,983 B2 * | 12/2010 | Kawada et al. | 439/607.46 |
| 8,011,950 B2 * | 9/2011 | McGrath et al. | 439/497 |
| 2010/0029104 A1 * | 2/2010 | Patel et al. | 439/76.1 |
| 2010/0041273 A1 * | 2/2010 | Scherer et al. | 439/607.01 |

* cited by examiner

*Primary Examiner* — Neil Abrams
*Assistant Examiner* — Travis Chambers

(57) ABSTRACT

An electrical connector includes a circuit board having an internal ground plane that defines at least a portion of an internal layer of the circuit board. The circuit board has an exterior side that includes a mounting region and includes electrical contacts arranged on the exterior side within the mounting region for making electrical connection with corresponding signal conductors of electrical wires. Ground shields are mounted to the mounting region of the circuit board and include electrically conductive bodies that are configured to extend over corresponding electrical wires along the mounting region of the circuit board. The bodies of the ground shields include side segments that are configured to extend between the signal conductors of adjacent electrical wires along the mounting region of the circuit board. The bodies are engaged with the internal ground plane of the circuit board to electrically connect the ground shields to the internal ground plane.

20 Claims, 7 Drawing Sheets

CIRCUIT BOARD AND WIRE ASSEMBLY

BACKGROUND OF THE INVENTION

The subject matter described and/or illustrated herein relates generally to circuit boards, and more particularly, to circuit boards that terminate electrical wires.

Electrical wires are sometimes used to electrically connect electrical components to circuit boards. Specifically, ends of such electrical wires may be terminated to the circuit board to electrically connect the circuit board to an electrical component that terminates the opposite ends of the electrical wires. Such electrical wires may be individual electrical wires, or two or more electrical wires may be grouped together in a cable. One example of a circuit board that terminates electrical wires is a circuit board of an electrical connector.

Competition and market demands have continued the trend toward smaller and higher performance (e.g., faster) electronic systems. But, the signal paths within such smaller and higher performance electronic systems may interfere with each other, which is commonly referred to as "crosstalk". One source of crosstalk is the wire mount area where electrical wires are mounted to contact pads of a circuit board, for example using solder. For example, electrical wires that are mounted to a circuit board may experience crosstalk with adjacent electrical wires that are mounted to the same side of the circuit board. Such crosstalk can become a relatively large contributor to errors along the signal paths of the electrical wires and/or the circuit board.

There is a need for a circuit board and wire assembly that experiences less crosstalk between electrical wires that are terminated to the same side of a circuit board.

BRIEF DESCRIPTION OF THE INVENTION

In one embodiment, an electrical connector is provided for terminating electrical wires. The electrical connector includes a circuit board having an internal ground plane that defines at least a portion of an internal layer of the circuit board. The circuit board has an exterior side that includes a mounting region. The circuit board includes electrical contacts arranged on the exterior side within the mounting region for making electrical connection with corresponding signal conductors of the electrical wires. Ground shields are mounted to the mounting region of the circuit board and include electrically conductive bodies that are configured to extend over corresponding electrical wires along the mounting region of the circuit board. The bodies of the ground shields include side segments that are configured to extend between the signal conductors of adjacent electrical wires along the mounting region of the circuit board. The bodies of the ground shields are engaged with the internal ground plane of the circuit board to electrically connect the ground shields to the internal ground plane.

In another embodiment, a circuit board and wire assembly includes electrical wires having signal conductors, and a circuit board having an internal ground plane that defines at least a portion of an internal layer of the circuit board. The circuit board has an exterior side that includes a mounting region. The circuit board includes electrical contacts that extend on the exterior side within the mounting region. The electrical wires are mounted to the exterior side such that the signal conductors of the electrical wires are electrically connected to corresponding electrical contacts. Ground shields are mounted to the mounting region of the circuit board. The ground shields include electrically conductive bodies that extend over corresponding electrical wires along the mounting region of the circuit board. The bodies of the ground shields comprising side segments that extend between the signal conductors of adjacent electrical wires along the mounting region of the circuit board. The bodies of the ground shields are engaged with the internal ground plane of the circuit board to electrically connect the ground shields to the internal ground plane.

In another embodiment, an electrical connector is provided for terminating electrical wires. The electrical connector includes a circuit board having an exterior side that includes a mounting region. The circuit board includes electrical contacts arranged on the exterior side within the mounting region for making an electrical connection with corresponding signal conductors of the electrical wires. Ground shields are mounted to the mounting region of the circuit board. The ground shields include electrically conductive bodies that are configured to extend over corresponding electrical wires along the mounting region of the circuit board. The bodies of the ground shields include side segments that are configured to extend between the signal conductors of adjacent electrical wires along the mounting region of the circuit board. The ground shields are arranged within the mounting region in a row that extends along a row axis. Adjacent ground shields along the row are staggered on respective opposite sides of the row axis.

DETAILED DESCRIPTION OF THE INVENTION

Figure 1:
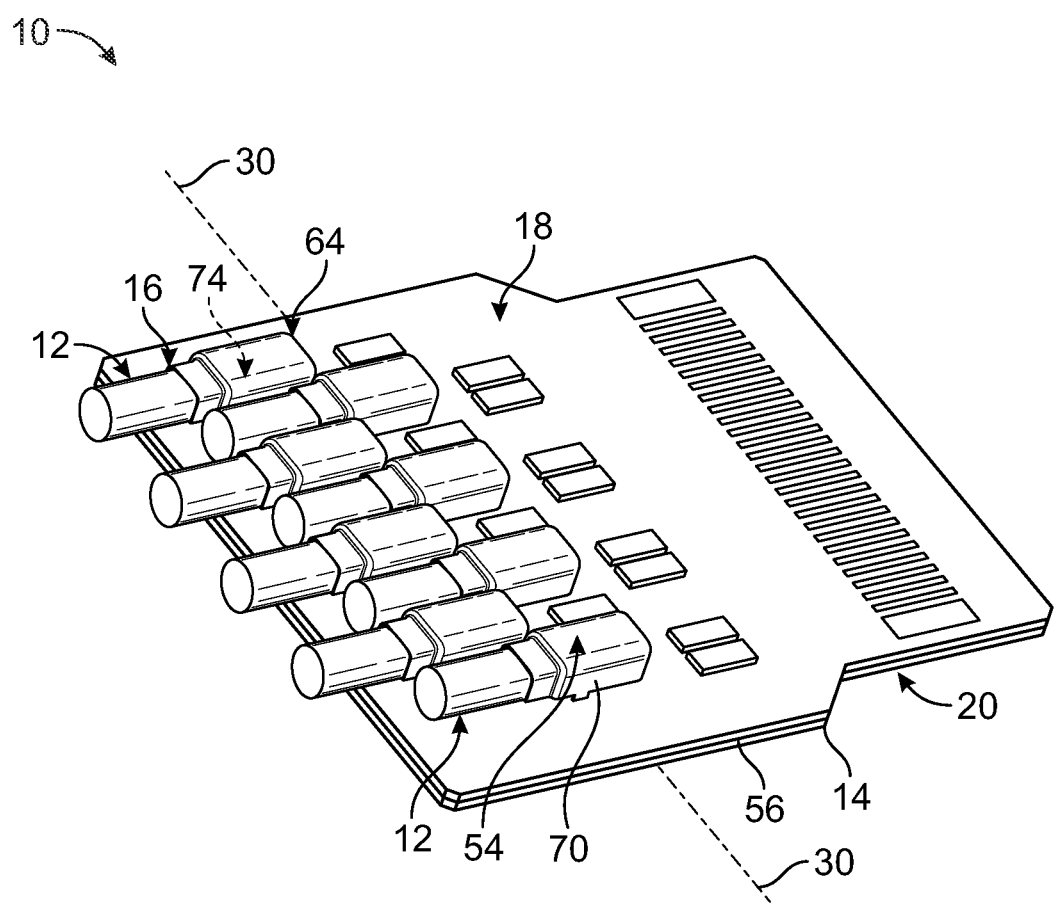
FIG. 1 is a perspective view of an exemplary embodiment a circuit board and wire assembly.

FIG. 1 is a perspective view of an exemplary embodiment of a circuit board and wire assembly 10. The assembly 10 includes electrical wires 12 and a circuit board 14 that terminates ends 16 of the electrical wires 12. The assembly 10 may be a component of any larger electrical component, system, and/or the like, such as, but not limited to, an electrical connector and/or the like. One example of an electrical connector within which the circuit board and wire assembly 10 may be used is a high-speed input/output (I/O) connector, such as, but not limited to, the I/O connector 100 shown in FIG. 8. The electrical wires 12 may electrically connect the circuit board 14 to any electrical component(s). In other words, ends (not shown) of the electrical wires 12 that are opposite the ends 16 may terminate any other electrical component(s). As will be described below, the assembly 10 includes ground shields 64 that extend over corresponding electrical wires 12 and are engaged with, and thereby electrically connected to, a ground plane 56 of the circuit board 14.

Figure 2:
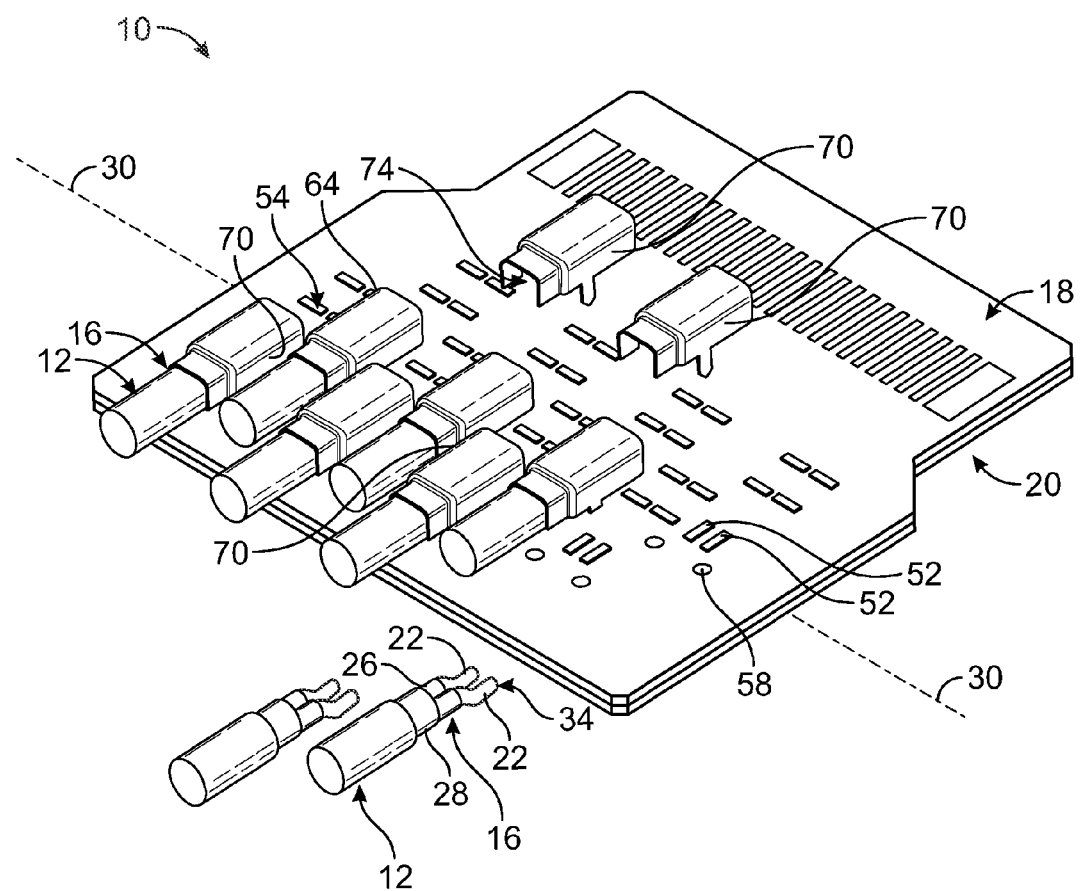
FIG. 2 is a partially exploded perspective view of the circuit board and wire assembly shown in FIG. 1.

FIG. 2 is a partially exploded perspective view of the circuit board and wire assembly 10. In the exemplary embodiment, the electrical wires 12 are terminated to an exterior side 18 of the circuit board 14. In other embodiments, the assembly 10 also includes electrical wires 12 that are terminated to an exterior side 20 of the circuit board 14 that is opposite the exterior side 18. Each electrical wire 12 includes one or more signal conductors 22. Each electrical wire 12 may include any number of signal conductors 22, which may be arranged in any arrangement relative to each other. In the exemplary embodiment, each electrical wire 12 includes two signal conductors 22 that are arranged side-by-side, such that each electrical wire 12 is what is commonly referred to as a "twinax cable" or a "twin axial cable". The electrical wires 12 may include differential signal pairs of signal conductors 22. A differential signal pair of signal conductors 22 is optionally contained within the same electrical wire 12. In the exemplary embodiment, each electrical wire 12 includes a differential signal pair of signal conductors 22. Any number of electrical wires 12 may be terminated to the circuit board 14. Some or all of the electrical wires 12 may be grouped together in one or more cables (not shown).

The exemplary structure of the electrical wires 12 will now be described. In the exemplary embodiment, each electrical wire 12 includes the differential signal pair of signal conductors 22. The signal conductors 22 of each electrical wire 12 are surrounded, and separated, by an insulating member 26 of the electrical wire 12. The insulating member 26 may be a single member that surrounds both signal conductors 22, or may be two discrete members that surround corresponding signal conductors 22 of the electrical wire 12. Optionally, a ground conductor 28 extends around the insulating member 26 of one or more of the electrical wires 12. One or more of the electrical wires 12 optionally includes a drain wire (not shown).

At the ends 16 of the electrical wires 12, the signal conductors 22 include exposed end segments 34 that extend lengths outward from ends of the insulating members 26. The exposed end segments 34 are thus exposed from the insulating members 26. The exposed end segments 34 enable the electrical wires 12, and specifically the electrical signal conductors 22, to be mounted to mounting pads 52 of the circuit board 14, for example using solder or an electrically conductive adhesive.

Figure 3:
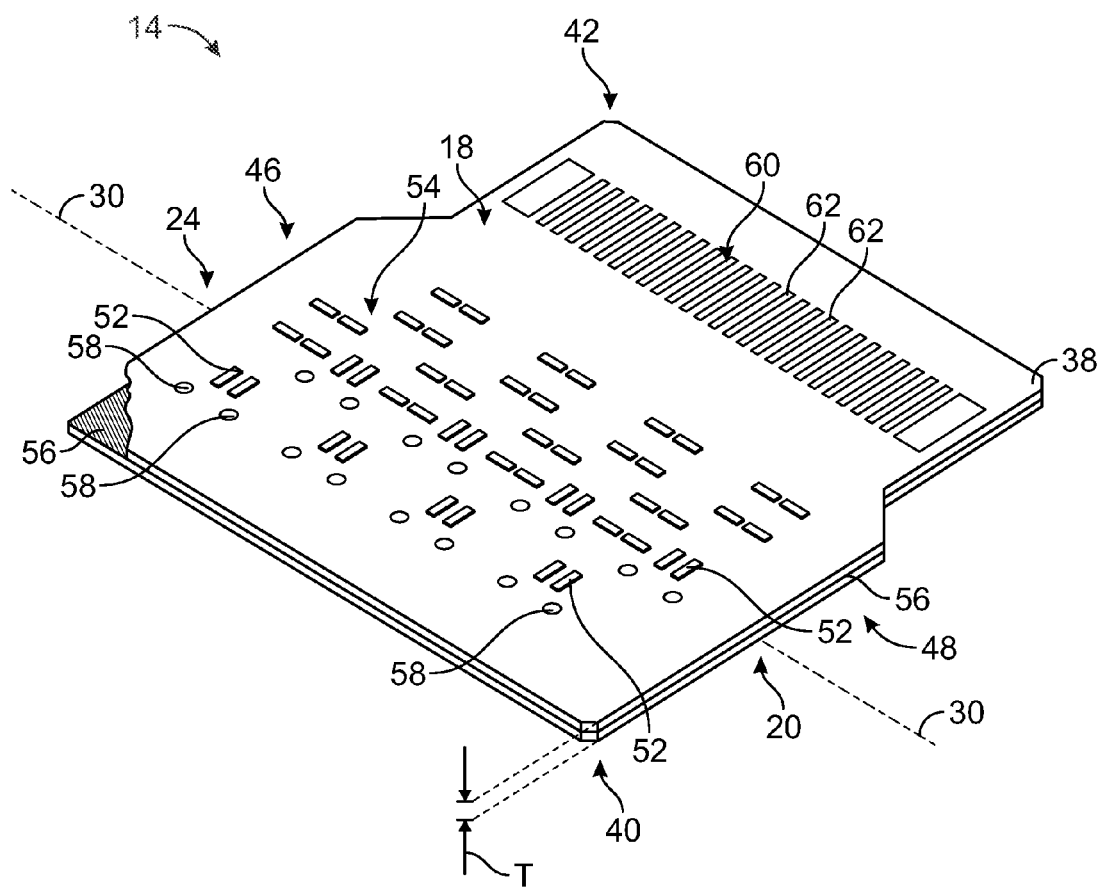
FIG. 3 is a perspective view of an exemplary embodiment of a circuit board of the circuit board and wire assembly shown in FIG. 1 illustrating an exterior side of the circuit board.

FIG. 3 is a perspective view of an exemplary embodiment of the circuit board 14 illustrating the exterior side 18 of the circuit board 14. The circuit board 14 includes a substrate 38 that includes the exterior sides 18 and 20. The substrate 38 extends from a mounting end 40 to an opposite end 42. Optionally, the opposite end 42 is a mating end wherein the circuit board 14 mates with a mating connector (not shown). The substrate 38 extends from an end 46 to an opposite end 48. The substrate 38 extends a thickness T from the side 18 to the side 20.

The circuit board 14 includes mounting pads 52 to which the electrical wires 12 are terminated. The exterior side 18 of the substrate 38 includes a mounting region 54 at which the electrical wires 12 are terminated to the circuit board 14. Specifically, the mounting pads 52 extend on the exterior side 18 of the substrate 38 within the mounting region 54. In the exemplary embodiment, the mounting pads 52 are arranged in a row 24 that extends a length along a row axis 30. As can be seen in FIG. 3, adjacent pairs of mounting pads 52 within the row 24 are staggered on respective opposite sides of the row axis 30. The mounting pads 52 may have any other arrangement, pattern, and/or the like along the exterior side 18 of the substrate 38. The mounting pads 52 may be referred to herein as "electrical contacts".

The circuit board 14 includes the ground plane 56 that is held by the substrate 38. A portion of the substrate 38 has been broken away in FIG. 3 to illustrate the ground plane 56. In the exemplary embodiment, the ground plane 56 is an internal layer of the circuit board 14 that extends within the thickness T of the circuit board 14 between the exterior sides 18 and 20. The exemplary embodiment of the ground plane 56 defines an internal layer of the circuit board 14. In addition or alternatively, the circuit board 14 may include a ground plane (not shown) that extends on the exterior side 18 of the substrate 38 and/or may include a ground plane (not shown) that extends on the exterior side 20 of the substrate 38. The circuit board 14 may include any number of ground planes. Moreover, the circuit board 14 may include any number of layers. The ground plane 56 may be referred to herein as an "internal ground plane".

In the exemplary embodiment, the ground plane 56 extends along an approximate entirety of the substrate 38 from the mounting end 40 to the opposite end 42, and extends along an approximate entirety of the substrate from the end 46 to the end 48. But, the ground plane 56 may extend only partially between the ends 40 and 42 and/or only partially between the ends 46 and 48.

The circuit board 14 includes openings 58 that extend through the exterior side 18 and through at least a portion of the thickness T of the circuit board 14. The openings 58 extend through the exterior side 18 and the thickness T of the circuit board 14 at least to the ground plane 56. In other words, the openings 58 communicate with the ground plane 56 and expose the ground plane 56 along the exterior side 18. In the some embodiments, the openings 58 are electrically conductive vias that provide an electrical path from the ground plane 56 to the exterior side 18. As will be described below, the openings 58 enable the ground shields 64 (FIGS. 1, 2, and 4-7) to engage, and thereby be electrically connected to, the ground plane 56.

The circuit board 14 may be configured to mate with a mating connector. For example, the end 42 of the substrate 38 may define a card edge that is configured to mate with a complementary mating connector. In the exemplary embodiment, the exterior side 18 of the substrate 38 includes a mating region 60 that defines a portion of the card edge that mates with the complementary mating connector. The circuit board 14 includes mating pads 62 that extend on the exterior side 18 of the substrate 38 within the mating region 60. The mating pads 62 mate with corresponding mating contacts (not shown) of the complementary mating connector to establish an electrical connection between the circuit board 14 and the complementary mating connector. In embodiments wherein the circuit board 14 is configured to mate with a mating connector, the exterior side 20 may include mating pads (not shown) that extend on the exterior side 20 for mating with corresponding mating contacts of the mating connector.

Figure 4:
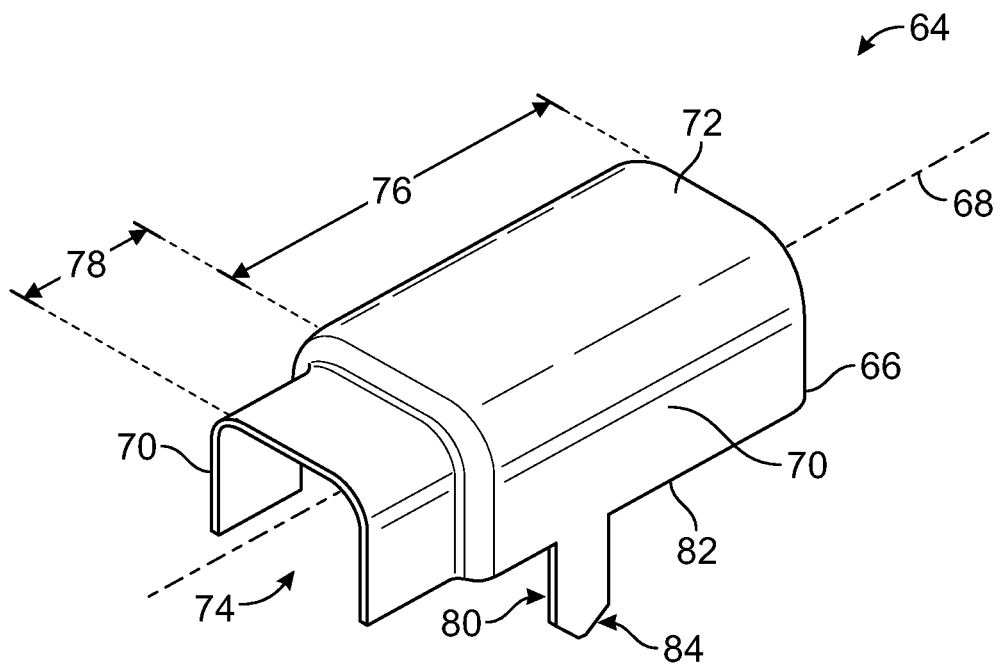
FIG. 4 is an upper perspective view of an exemplary embodiment of a ground shield of the circuit board and wire assembly shown in FIGS. 1 and 2.
Figure 5:
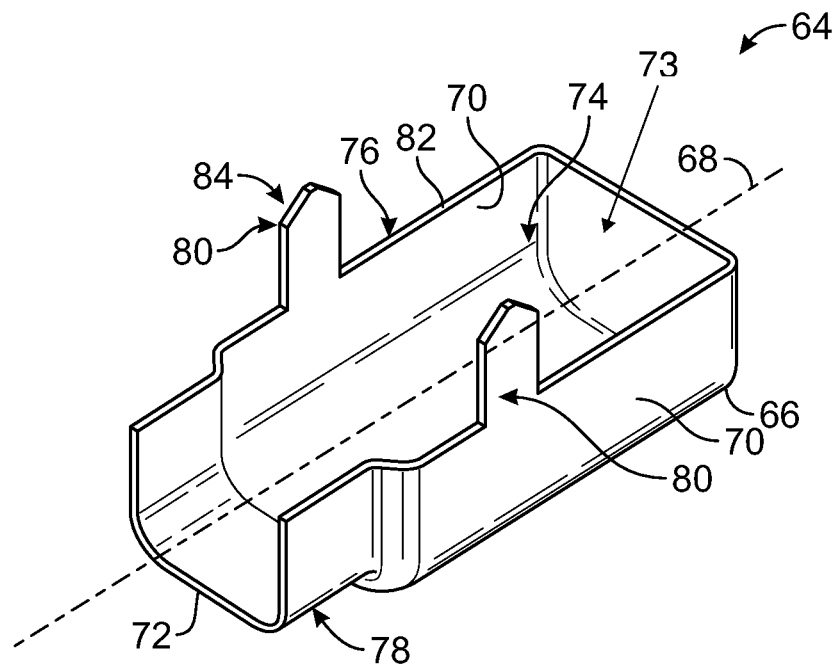
FIG. 5 is a lower perspective view of the ground shield shown in FIG. 4.

FIGS. 4 and 5 are upper and lower perspective views of an exemplary embodiment of a ground shield 64 of the circuit board and wire assembly 10. As will be described below, the ground shield 64 is configured to be mounted to the mounting region 54 (FIGS. 1-3) of the circuit board 14 (FIGS. 1-3 and 6-8) and extend over a corresponding electrical wire 12 (FIGS. 1, 2, and 7) along the mounting region 54. The ground shield 64 includes an electrically conductive body 66 that extends a length along a central longitudinal axis 68. The body 66 includes side segments 70 and an upper segment 72 that extends between, and interconnects, the side segments 70. An optional end segment 73 (not visible in FIG. 4) is connected to, and extends between, edges of the side segments 70 and the upper segment 72. The segments 70, 72, and 73 define an interior compartment 74 of the body 66 that is configured to receive the corresponding electrical wire 12 therein. In other words, the segments 70, 72, and 73 cooperate to define an enclosure for the corresponding signal conductors 22 (FIGS. 2 and 7) of the corresponding electrical wire 12 when the signal conductors 22 are mounted to mounting pads 52 (FIGS. 2, 3, and 7) of the circuit board 14. As will be described below, the side segments 70 are configured to extend between the signal conductors 22 of adjacent electrical wires 12.

The body 66 includes a signal segment 76 and a ground segment 78 that extends from the signal segment 76. In the exemplary embodiment, the signal segment 76 and the ground segment 78 each include portions of the side segments 70 and the upper segment 72. The signal segment 76 is configured to extend over the signal conductors 22 of the corresponding electrical wire 12. The ground segment 78 is configured to extend over the ground conductor 28 of the corresponding electrical wire 12. Optionally, the ground segment 78 is offset from the signal segment 76 in a radially inner direction relative to the central longitudinal axis 68, as can be seen in FIGS. 4 and 5.

Figure 6:
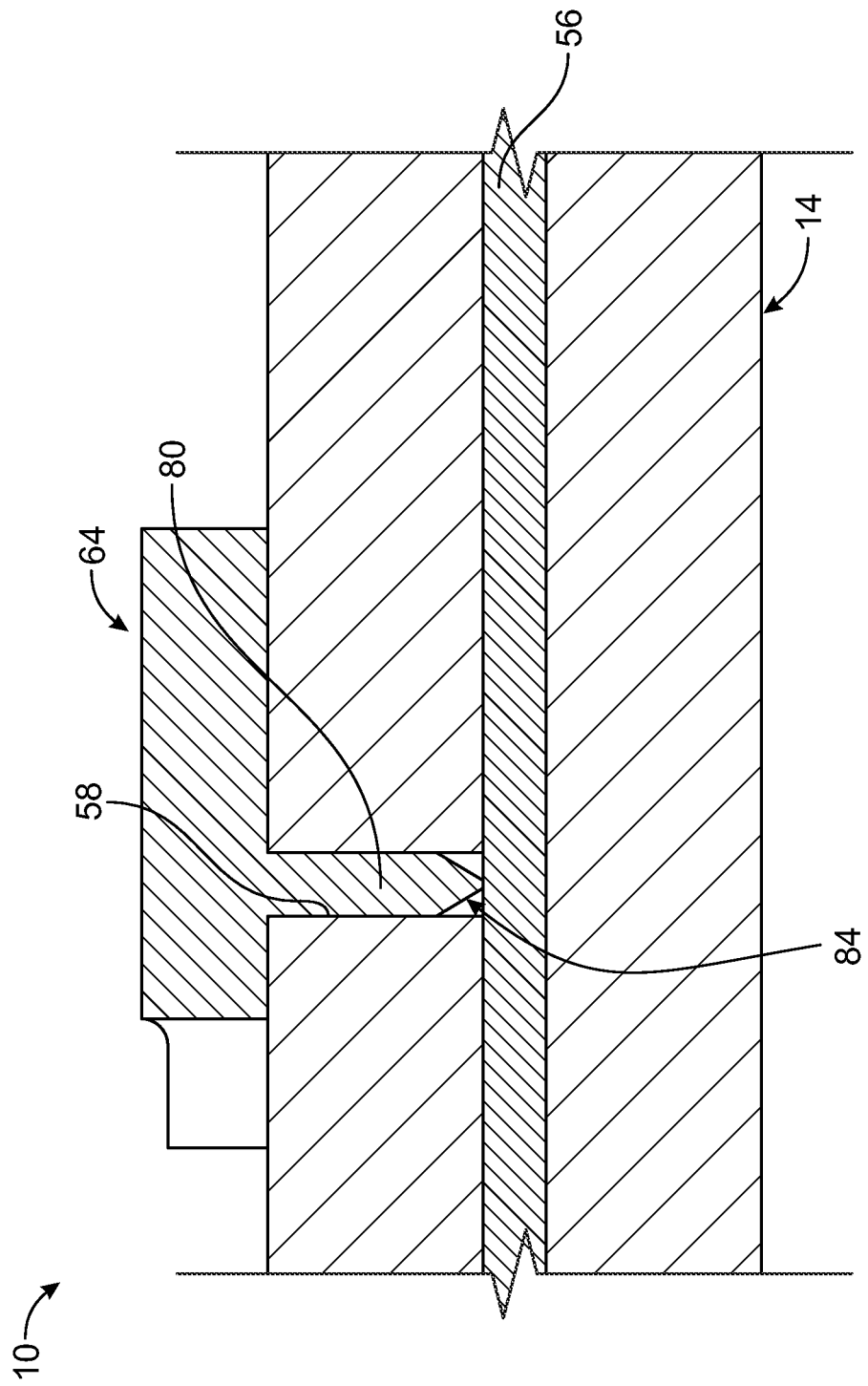
FIG. 6 is a cross-sectional view of the circuit board and wire assembly shown in FIG. 1.

The body 66 of the ground shield 64 includes one or more legs 80 that extend from an edge 82 of a corresponding side segment 70. The legs 80 extend outward from the edges 82 in a direction away from the upper segment 72. The legs 80 extend to free ends 84. The legs 80 are configured to be received within corresponding openings 58 (FIGS. 2, 3, and 6) of the circuit board 14 and engage the ground plane 56 (FIGS. 1, 3, and 6). The legs 80 may have any geometry that enables the legs 80 to be received into the openings 58 into engagement with the ground plane 56. The legs 80 may be configured to be mechanically connected to the circuit board 14. For example, in the exemplary embodiment, the legs 80 are configured to provide an interference-fit with the openings 58 of the circuit board 14. The body 66 may include any number of legs 80.

Referring again to FIGS. 1 and 2, the electrical wires 12 are terminated to the circuit board 14. The exposed end segments 34 (not visible in FIG. 1) of the signal conductors 22 (not visible in FIG. 1) of the electrical wires 12 are mounted to the corresponding mounting pads 52 (not visible in FIG. 1) of the circuit board 14. The mounting of an exposed end segment 34 of a signal conductor 22 to the corresponding mounting pad 52 can also be seen in FIG. 7. Each of the exposed end segments 34 may be mounted to the corresponding mounting pad 52 using any suitable method, structure, attachment means, and/or the like that electrically connects the exposed segments 34 to the corresponding mounting pad 52, such as, but not limited to, using solder, using an electrically conductive adhesive, and/or the like. Optionally, the electrical wires 12 are mounted to the circuit board 14 such that adjacent electrical wires 12 and the corresponding ground shields 64 in the row 24 are staggered on respective opposite sides of the row axis 30. For example, the end segments 73 (FIG. 5) of adjacent ground shields 64 along the row 24 are staggered on respective opposite sides of the row axis 30.

The ground shields 64 are mounted to the mounting region 54 of the circuit board 14. As can be seen in FIGS. 1 and 2, the ground shields 64 are individual ground shields 64 that are discrete components from each other. The end 16 of each electrical wire 12 is received within the internal compartment 74 of the corresponding ground shield 64. As should be apparent from FIGS. 1 and 2, the side segments 70 of the ground shields 64 extend between the exposed segments 34 of the signal conductors 22 of adjacent electrical wires 12. The side segments 70 provide electrical shielding between the exposed segments 34 of the signal conductors 22 of adjacent electrical wires 12 along the exterior side 18 of the circuit board 14. As described above, in the exemplary embodiment, the electrical wires 12 include differential signal pairs of the signal conductors 22. The side segments 70 of the ground shields 64 extend between the differential signal pairs of adjacent electrical wires 12 to shield adjacent differential signal pairs from each other along the exterior side 18 of the circuit board 12.

FIG. 6 is a cross-sectional view of the circuit board and wire assembly 10 illustrating engagement between the ground shields 64 and the ground plane 56. As can be seen in FIG. 6, the leg 80 extends into the corresponding opening 58 of the circuit board 14. The free end 84 of the leg 80 is engaged with the ground plane 56. The engagement between the free ends 84 of the legs 80 and the ground plane 56 electrically connects the ground shields 64 to the ground plane 56.

The leg 80 may also provide a mechanical connection to the circuit board 14. For example, in the exemplary embodiment, the leg 80 is received within the opening 58 with an interference-fit that provides a mechanical connection between the leg 80 and the circuit board 14.

As described above, in some embodiments, the openings 58 are electrically conductive vias. In such embodiments wherein the openings 58 are electrically conductive vias, the leg 80 extends into the via in electrical engagement therewith. Moreover, in embodiments wherein the openings 58 are electrically conductive vias, the electrically conductive via may be electrically connected to the ground plane 56 and the leg 80 may or may not engage the ground plane 56. In other words, in embodiments wherein the openings 58 are electrically conductive vias, the electrical connection between the ground shield 64 and the ground plane 56 may be provided by the via in addition or alternative to the engagement between the leg 80 and the ground plane 56.

Figure 7:
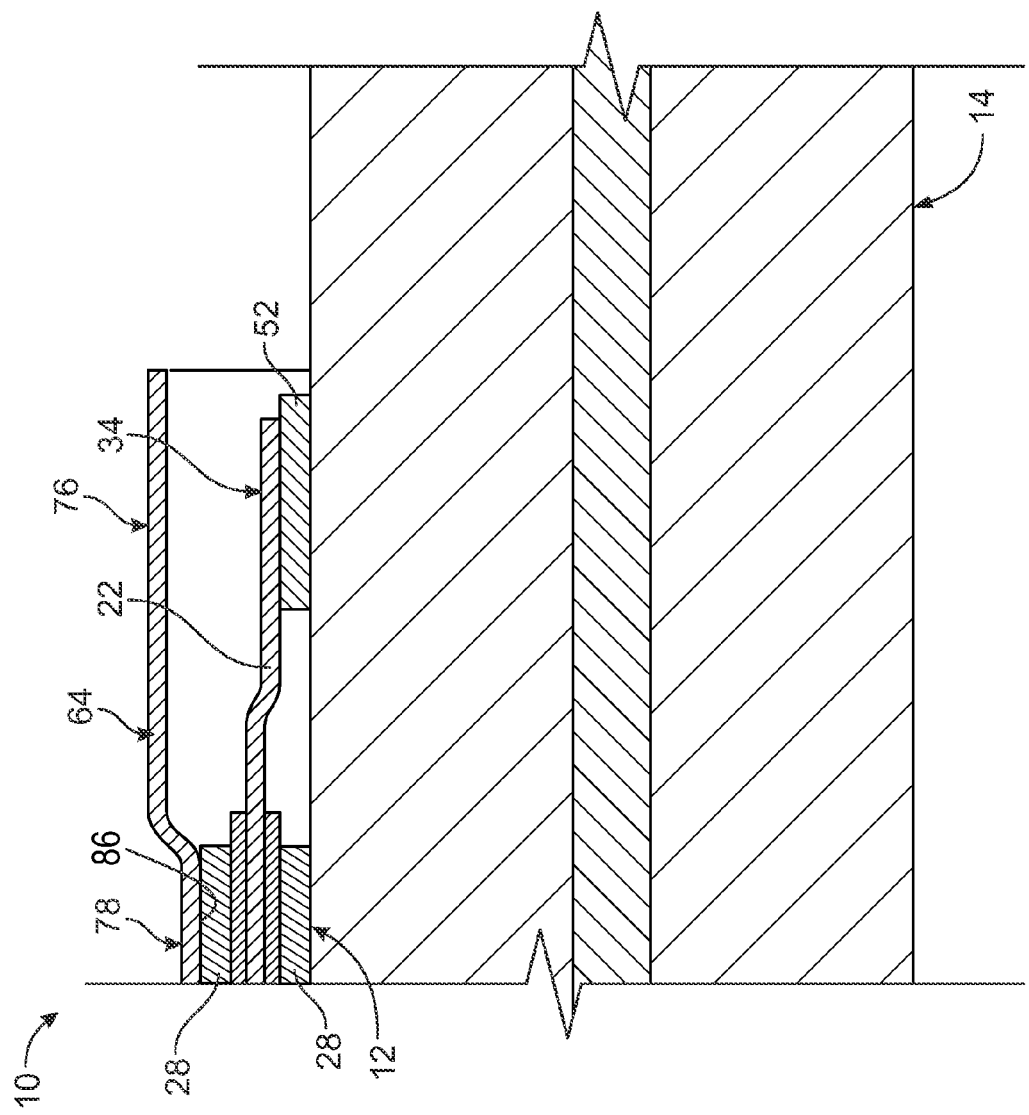
FIG. 7 is another cross-sectional view of the circuit board and wire assembly shown in FIG. 1.

FIG. 7 is another cross-sectional view of the circuit board and wire assembly 10 illustrating engagement between the ground segments 78 of the ground shields 64 and the ground conductors 28 of the electrical wires 12. As can be seen in FIG. 7, the signal segment 76 of the ground shield 64 extends over the exposed end segment 34 of the signal conductor 22 of the corresponding electrical wire 12. The ground segment 78 of the ground shield 64 extends over the ground conductor 28 of the corresponding electrical wire 12. Optionally, an interior surface 86 of the ground segment 78 is engaged with the ground conductor 28 to electrically connect the ground shield 64 to the ground conductor 28 of the corresponding electrical wire 12.

Figure 8:
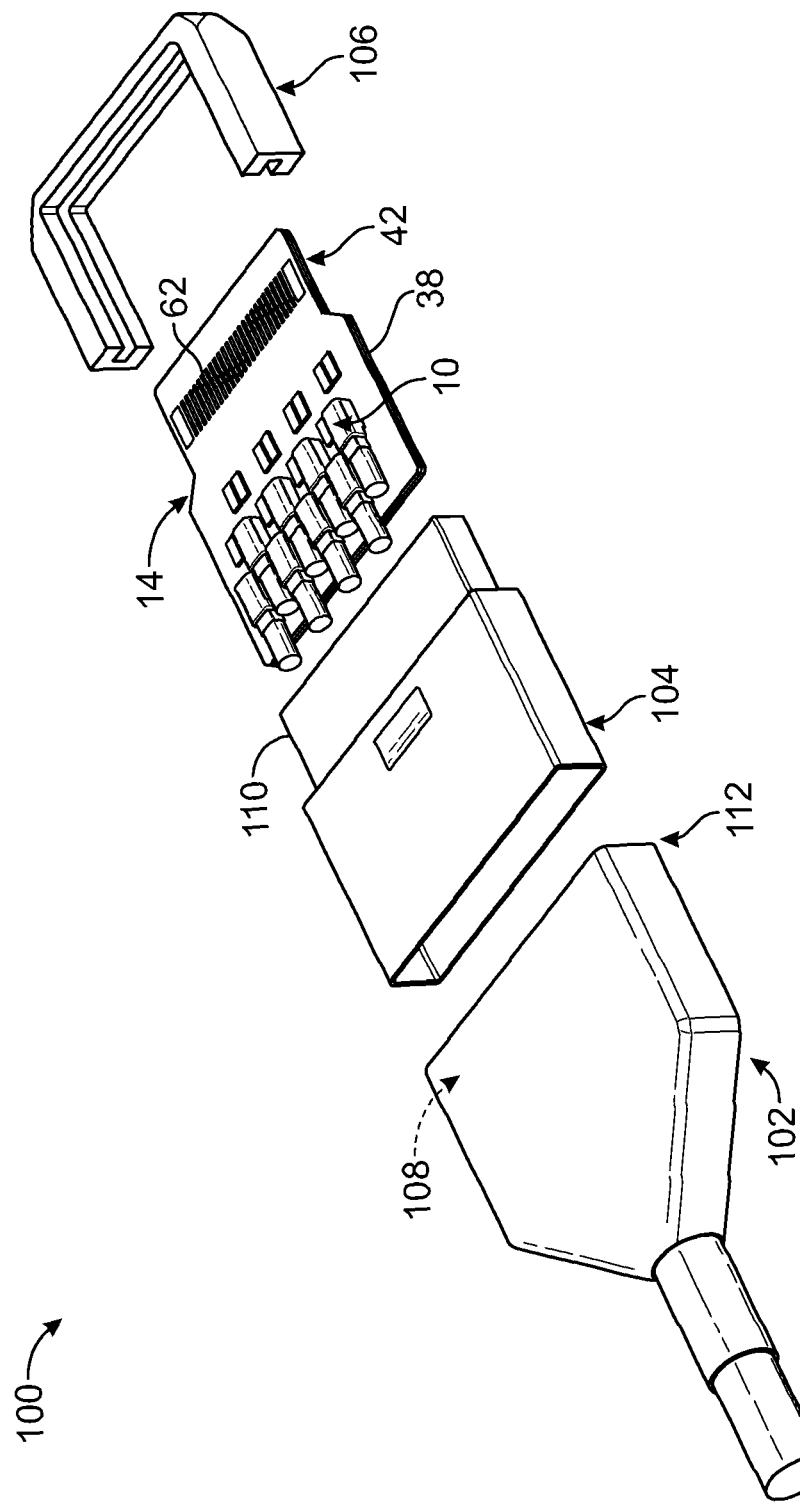
FIG. 8 is a perspective view of an exemplary embodiment of an electrical connector with which the circuit board and wire assembly shown in FIGS. 1, 2, 6, and 7 may be used.

FIG. 8 is an exploded perspective view of an exemplary embodiment of an electrical connector 100 with which the circuit board and wire assembly 10 may be used. The electrical connector 100 includes a housing 102, an insert 104, the circuit board 14, and a front cover 106. The housing 102 includes an interior compartment 108 within which the assembly 10 and the insert 104 are held. The insert 104 includes an extension 110 that extends outward from a front 112 of the housing 102.

The insert 104 holds the circuit board 14 such that the end 42 of the substrate 38 extends within the extension 110 for mating with a complementary mating connector (not shown). Specifically, the end 42 of the substrate 38 defines a card edge that is configured to mate with the complementary mating connector. The circuit board 14 includes the mating pads 62 that mate with corresponding mating contacts (not shown) of the complementary mating connector to establish an electrical connection between the electrical connector 100 and the complementary mating connector.

The electrical wires 12 are shown and described herein as being twinax cables that include two electrical signal conductors 22 that operate as a differential signal pair. However, the subject matter described and/or illustrated herein is not limited to twin axial cables, nor cables having two electrical conductors that operate as a differential signal pair. Rather, the subject matter described and/or illustrated herein may be used with any type of electrical wire having any number of electrical signal conductors, whether or not the electrical wire includes one or more differential signal pairs of electrical signal conductors, one or more insulating members, a cable jacket, one or more ground shields, one or more drain wires, and/or the like.

As used herein, the term "circuit board" is intended to mean any electric circuit in which the electrical conductors have been printed or otherwise deposited in predetermined patterns on an electrically insulating substrate. The circuit board 14 may be a flexible member or a rigid member. The circuit board 14 may be fabricated from and/or may include any material(s), such as, but not limited to, ceramic, epoxy-glass, polyimide (such as, but not limited to, Kapton® and/or the like), organic material, plastic, polymer, and/or the like. In some embodiments, the circuit board 14 is a rigid member fabricated from epoxy-glass.

The embodiments described and/or illustrated herein may provide a circuit board and wire assembly that experiences less crosstalk between electrical wires that are terminated to the circuit board.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the subject matter described and/or illustrated herein should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

What is claimed is:

1. An electrical connector for terminating electrical wires, the electrical connector comprising:
   a circuit board comprising an internal ground plane that defines at least a portion of an internal layer of the circuit board, the circuit board having an exterior side that includes a mounting region, the circuit board comprising electrical contacts arranged on the exterior side within the mounting region for making electrical connection with corresponding signal conductors of the electrical wires; and
   ground shields mounted to the mounting region of the circuit board, the ground shields comprising electrically conductive bodies that are configured to extend over corresponding electrical wires along the mounting region of the circuit board, the bodies of the ground shields comprising side segments that are configured to extend between the signal conductors of adjacent electrical wires along the mounting region of the circuit board, wherein the bodies of the ground shields are engaged with the internal ground plane of the circuit board to electrically connect the ground shields to the internal ground plane.

2. The electrical connector of claim 1, wherein the circuit board comprises openings that extend through the exterior side and through at least a portion of a thickness of the circuit board, the bodies of the ground shields comprising legs that extend into corresponding openings and engage the internal ground plane.

3. The electrical connector of claim 1, wherein the circuit board comprises electrically conductive vias that extend through the exterior side and through at least a portion of a thickness of the circuit board, the bodies of the ground shields comprising legs that extend into corresponding vias in electrical engagement therewith, the legs being engaged with the internal ground plane.

4. The electrical connector of claim 1, wherein the circuit board comprises openings that extend through the exterior side and through at least a portion of a thickness of the circuit board, the bodies of the ground shields comprising legs that extend into corresponding openings, the legs providing the bodies with both a mechanical connection to the circuit board and an electrical connection to the internal ground plane.

5. The electrical connector of claim 1, wherein the electrical wires include ground conductors, the bodies of the ground shields being configured to be engaged with the ground conductors of corresponding electrical wires to electrically connect the ground shields to the ground conductors.

6. The electrical connector of claim 1, wherein the ground shields are individual ground shields that are discrete components from each other.

7. The electrical connector of claim 1, wherein the bodies of the ground shields extend lengths along corresponding central longitudinal axes, the bodies comprising signal segments that are configured to extend over the signal conductors of the corresponding electrical wires and ground segments that are configured to extend over the ground conductors of the corresponding electrical wires, the ground segments being offset from the signal segments in radially inner directions relative to the corresponding central longitudinal axes.

8. The electrical connector of claim 1, wherein the electrical contacts are arranged within the mounting region in a row that extends along a row axis, the electrical contacts are arranged in pairs along the row, and adjacent pairs of the electrical contacts are staggered on respective opposite sides of the row axis.

9. The electrical connector of claim 1, wherein each electrical wire comprises a differential signal pair of the signal conductors.

10. A circuit board and wire assembly comprising:
    electrical wires having signal conductors;
    a circuit board comprising an internal ground plane that defines at least a portion of an internal layer of the circuit board, the circuit board having an exterior side that includes a mounting region, the circuit board comprising electrical contacts that extend on the exterior side within the mounting region, the electrical wires being mounted to the exterior side such that the signal conductors of the electrical wires are electrically connected to corresponding electrical contacts; and ground shields mounted to the mounting region of the circuit board, the ground shields comprising electrically conductive bodies that extend over corresponding electrical wires along the mounting region of the circuit board, the bodies of the ground shields comprising side segments that extend between the signal conductors of adjacent electrical wires along the mounting region of the circuit board, wherein the bodies of the ground shields are engaged with the internal ground plane of the circuit board to electrically connect the ground shields to the internal ground plane.

11. The assembly of claim 10, wherein the circuit board comprises openings that extend through the exterior side and through at least a portion of a thickness of the circuit board, the bodies of the ground shields comprising legs that extend into corresponding openings and engage the internal ground plane.

12. The assembly of claim 10, wherein the circuit board comprises electrically conductive vias that extend through the exterior side and through at least a portion of a thickness of the circuit board, the bodies of the ground shields comprising legs that extend into corresponding vias in electrical engagement therewith, the legs being engaged with the internal ground plane.

13. The assembly of claim 10, wherein the circuit board comprises openings that extend through the exterior side and through at least a portion of a thickness of the circuit board, the bodies of the ground shields comprising legs that extend into corresponding openings, the legs providing the bodies with both a mechanical connection to the circuit board and an electrical connection to the internal ground plane.

14. The assembly of claim 10, wherein the electrical wires include ground conductors, the bodies of the ground shields being engaged with the ground conductors of corresponding electrical wires to electrically connect the ground shields to the ground conductors.

15. The assembly of claim 10, wherein the ground shields are individual ground shields that are discrete components from each other.

16. The assembly of claim 10, wherein the bodies of the ground shields extend lengths along corresponding central longitudinal axes, the bodies comprising signal segments that extend over the signal conductors of the corresponding electrical wires and ground segments that extend over the ground conductors of the corresponding electrical wires, the ground segments being offset from the signal segments in radially inner directions relative to the corresponding central longitudinal axes.

17. The assembly of claim 10, wherein the electrical wires and the corresponding ground shields are arranged within the mounting region in a row that extends along a row axis, adjacent electrical wires and the corresponding ground shields being staggered relative to each other along the row axis.

18. The assembly of claim 10, wherein each electrical wire comprises a differential signal pair of the signal conductors.

19. An electrical connector for terminating electrical wires, the electrical connector comprising:

a circuit board having an exterior side that includes a mounting region, the circuit board comprising electrical contacts arranged on the exterior side within the mounting region for making an electrical connection with corresponding signal conductors of the electrical wires; and ground shields mounted to the mounting region of the circuit board, the ground shields comprising electrically conductive bodies that are configured to extend over corresponding electrical wires along the mounting region of the circuit board, the bodies of the ground shields comprising side segments that are configured to extend between the signal conductors of adjacent electrical wires along the mounting region of the circuit board, the ground shields being arranged within the mounting region in a row that extends along a row axis, wherein adjacent ground shields along the row are staggered on respective opposite sides of the row axis.

20. The electrical connector of claim 19, wherein the ground shields comprise upper segments and end segments connected to the side segments, the upper end, and side segments cooperating to define an enclosure for the signal conductor of a corresponding electrical wire when the signal conductor is mounted to the corresponding electrical contact of the circuit board, wherein the end segments of adjacent ground shields along the row are staggered on respective opposite sides of the row axis.

* * * * *